United States Patent [19]
Mauri et al.

[11] Patent Number: 5,614,727
[45] Date of Patent: Mar. 25, 1997

[54] THIN FILM DIODE HAVING LARGE CURRENT CAPABILITY WITH LOW TURN-ON VOLTAGES FOR INTEGRATED DEVICES

[75] Inventors: Daniele Mauri; Wen Y. Lee; Cherngye Hwang, all of San Jose; Glen Garfunkel, Palo Alto, all of Calif.

[73] Assignee: International Business Machines Corporation, Armonk, N.Y.

[21] Appl. No.: 473,036

[22] Filed: Jun. 6, 1995

[51] Int. Cl.$^6$ ................................................. H01L 29/12
[52] U.S. Cl. ........................ 257/43; 257/44; 257/200; 349/50
[58] Field of Search .......................... 257/43, 44, 200, 257/766; 359/58, 60, 87, 88

[56] References Cited

U.S. PATENT DOCUMENTS

| | | | |
|---|---|---|---|
| 5,253,092 | 10/1993 | Takahashi | 359/58 |
| 5,272,370 | 12/1993 | French | 257/353 |
| 5,465,186 | 11/1995 | Bajorek | 360/113 |

OTHER PUBLICATIONS

H. Sato et al., "Transparent conducting p-type NiO thin films prepared by magnetron sputtering," Thin Solid Films Journal, vol. 236, 1993, pp. 27–31.

*Primary Examiner*—Minhloan Tran
*Attorney, Agent, or Firm*—Leslie G. Murray; Paik Saber

[57] ABSTRACT

A thin film diode and method of fabrication having large current capability and low-turn on voltage is provided as a switching or protective device against electrostatic discharge in integrated devices such as magnetoresistive sensors and the like. A first semiconductor thin film layer of $NiO_x$ having p type properties is disposed on an arbitrary substrate, such as alumina, glass, silicon dioxide, silicon and the like. A second semiconducting layer of tin oxide or indium oxide or other transparent oxide is joined to the first layer to form a p/n junction. In one method of fabrication, the p/n junction is formed in a sputtering process under a partial oxygen pressure to control the stoichiometry of the films. Gold and Gold Indium contacts are attached to the films to provide electrical contacts. The device is enclosed in a protective coating and connected in parallel with an electronic device subject to electrostatic discharge.

15 Claims, 3 Drawing Sheets

THIN FILM DIODE HAVING LARGE CURRENT CAPABILITY WITH LOW TURN-ON VOLTAGES FOR INTEGRATED DEVICES

BACKGROUND OF THE INVENTION

1. Field of the Invention

This invention relates to semiconductor devices and methods of manufacture. More particularly, the invention relates to thin film diodes having large current capability and methods of manufacture of such diodes on arbitrary substrates.

2. Description of Related Art

Silicon-based diodes, whether in discrete form or integrated on a circuit fulfill most application needs, for a large range of power requirements. There are, however, applications where it is desirable to fabricate diodes on arbitrary substrates. Examples include switching elements for active matrix liquid crystal displays or solar cells.

A popular material for these applications has been amorphous hydrogenated silicon (a-Si:H), typically deposited by plasma chemical vapor deposition processes (CVD). The main advantages are the compatibility with large substrates and low temperature processing and most importantly, the ability of doping during the deposition process. A large variety of a-Si:H device structures have been demonstrated: p/n, p/i/n and n/i/n junction, and Schottky diodes, thin film diodes (TFDs) and thin film transistors (TFT).

A limitation of amorphous hydrogenated silicon is its large resistivity (i.e., low mobility) which ranges from $10^8$ ohm-cm to roughly $10^3$ ohm-cm for an undoped and a heavily doped material, respectively. As a consequence, the forward characteristics of amorphous hydrogenated silicon above one volt are dominated by bulk resistance, limiting the current density at this voltage to about 1–10 Amperes per $cm^2$ ($A/cm^2$). Larger current densities could be achieved with the use of polycrystalline silicon, however, at significant costs in process complexity.

Large current capability in thin film diodes (TFD's), even outside the amorphous hydrogenated work, has not been generally emphasized, yet it could find important applications. Consider for example, the problem of providing electrostatic discharge (ESD) protection to microelectronic devices. On single crystal semiconductor wafers, ESD protect devices can be easily integrated with no additional complexity. In this context, we refer to "integrated" to signify a device fabricated on the same wafer surface, excluding therefore, hybrid arrangements incorporating discrete components. In the absence of a single crystal semiconductor substrate, an integrated ESD protect circuit requires the use of TFD's or TFT's.

In one embodiment of the present invention, TFD's have been used for wafer-level ESD protection of magnetoresistive (MR) sensors. The MR sensor is a thin metal film resistor (typically a few tens of ohms in resistance) of extremely small volume. The very limited ability to dissipate heat makes the MR sensor vulnerable to ESD current transients. A TFD connected in parallel could alleviate the problem by shunting the ESD current pulse. Consider for simplicity only one type of ESD discharge, the so-called Human Body Model type discharge, in which a 150 pF capacitor is charged to a voltage and discharged through the MR sensor with a 1500 ohm series resistor. When the capacitor is charged to 1500 volts, the discharge produces a current pulse of 1 Ampere (A) peak current with a 150 nanoseconds (ns) decay time constant. To be effective in protecting against these ESD events, while not degrading sensor performance, a shunting TFD must fulfill the following requirements:

(a) Turn on voltage not below the operating voltage of the sensor (0.3 to 0.5 volts) but not too high (</=1 volt);

(b) Low dynamic on resistance (1 to 2 ohm);

(c) Ability to survive discharges of 1 A peak current (combined with an area constraint of $4 \times 10^{-4}$ $cm^2$ corresponds to peak current densities of 2,500 $A/cm^2$); and (d) Diode capacitance <20 pF.

Nickel oxide ($NiO_x$) and Indium Tin Oxide (ITO) have been found to be suitable materials for use in a TFD which would meet the above requirements. The $NiO_x$ provides a p-type semiconductor layer while the ITO provides an n-type semiconductor layer to form a p/n junction diode.

In the prior art, one example of a thin film diode based on a junction between nickel oxide and an n-type conductive oxide is reported in "Transparent Conducting P-Type $NiO_x$ Thin Films Prepared by Magnetron Sputtering" by H. Sato et al., published in the Thin Solid Film Journal, Volume 236, pages 27–31, 1993. Sato et al., uses an n-type conductive oxide, zinc oxide, as an n-type layer. The Sato et al. diodes differ in several essential ways from the diodes described above, as follows:

(a) Simple p-n junctions are ohmic, not rectifying; diode behavior is only achieved in p/i/n structures with highly resistive layers at the active junction;

(b) The turn-on voltage is of the order of several volts, that is roughly 10 times greater than required for TFD's to be effective as an ESD shunt; and (c) Large current capability has not been demonstrated.

Indium tin oxide layers have also been used in metal diodes to provide or control the driving voltage for signal conductors in a liquid crystal display as shown in U.S. Pat. No. 5,253,092 entitled "Lateral MIM Device and Method of Production" issued Oct. 12, 1993 to K. Takahashi. The described indium tin oxide layer is used in combination with chromium (Cr) as a conductive layer. Zinc oxide is used as an insulating layer. The combination of NiOx and indium tin oxide as conductive layers in a thin film diode is not shown or disclosed in the Takahashi patent.

U.S. Pat. No. 5,272,370 entitled "Thin-Film ROM Devices and Their Manufacture" issued Dec. 21, 1993 to I. French, describes another utilization of indium tin oxide in the fabrication of metal insulator metal diodes. Again, $NiO_x$ is not shown or suggested in the French patent.

None of the prior art demonstrates a p/n junction thin film diode using $NiO_x$ and ITO which can be deposited on arbitrary substrates at low temperature using conventional deposition techniques. Nor does the prior art demonstrate applications having low turn-on voltage (0.5 volts) and large forward current capability (DC current densities greater than 10,000 $A/cm^2$). Moreover, the prior art does not provide low dynamic on resistance which makes available electrostatic discharge protection. The present invention solves the problem of providing TFD's having high current capability with low turn-on voltage, low dynamic resistance and low capacitance.

SUMMARY OF THE INVENTION

An object of the invention is to provide a film diode having large current capability and readily formable on arbitrary substrates.

Another object is to provide a thin film diode having $NiO_x$ as a p-type layer in combination with commonly used conductive oxides as an n-type layer.

Another object is to provide a thin film diode having $NiO_x$ or $NiFeO_x$ as a p-type layer and tin oxide or indium oxide or zinc oxide or tin oxide doped indium oxide as an n-type layer.

Another object is to provide a thin film diode using $NiO_x$ as a p-type layer and indium tin oxide as a n-type layer for ESD protection of magnetoresistive sensors.

Another object is to provide a method of manufacturing a thin film diode having $NiO_x$ as a first semiconductive layer and indium tin oxide as a second conductive layer.

Another object is to provide a method of forming $NiO_x$ as a semiconductive layer for a thin film diode.

These and other objects, advantages and features are achieved in a thin film diode having a first layer of $NiO_x$ with p-type semiconductor properties and a second layer of indium tin oxide with n-type properties, the combination of the first and second layers forming a p/n junction capable of sustaining forward DC current densities as high as 10,000 $A/cm^2$. A metal contact is connected to each layer to form an ohmic contact therewith for electrical terminals for the diode.

In another aspect, the thin film diode is fabricated using a metallic underlayer consisting of 3000 Angstroms (Å) of copper followed by 300 Å of Ni sputter deposited on a glass substrate forming a bottom contact. A first semiconductor layer of p-type material is formed by reactively sputtering a $NiO_x$ film from a metallic Ni target in a gas mixture of argon and 5% oxygen, using an RF diode sputtering process. A second semiconductor layer of n-type material is deposited in the same system immediately following the formation of the p-type layer. The second layer is 1200 Å of indium tin oxide reactively sputtered in the same conditions as the p-type layer from an oxide target containing a mixture of 90% indium oxide and 10% tin oxide. A top ohmic contact is formed on the n-type layer and the diode structure is covered with a layer of insulating material such as sputtered alumina. Plated gold contact pads connect to the p-type and n-type layer terminals through vias formed in the insulator layer.

BRIEF DESCRIPTION OF THE DRAWING

These and other features and advantages are illustrated in embodiments of the invention to be described by way of example with reference to the accompanying drawing.

DESCRIPTION OF THE PREFERRED EMBODIMENTS

Figure 1:
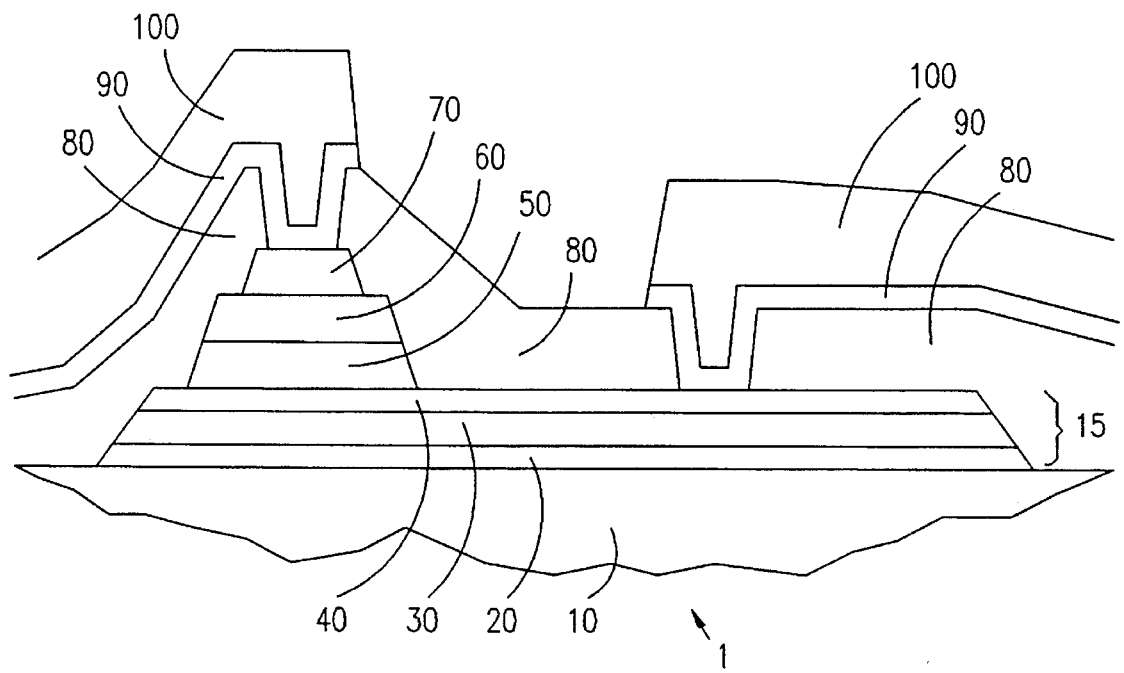
FIG. 1 is a schematic diagram illustrating a cross-sectional view of a thin film diode structure employing the principles of the present invention.

In FIG. 1, a thin film diode 1 is formed on a substrate 10, typically glass, alumina, or the like. A metal film comprised of one or more layers serves as a bottom contact 15. In one form the bottom contact 15 consists of 3 layers. Layer 20 is used to promote good adhesion and consists of 300 Å of Ni formed on the substrate 10. Layer 30 has high electrical conductance and consists in one form of 3000 Å of copper formed on layer 20. Layer 30 is overlayed with layer 40 consisting in one form of 300 Å of Ni, and is needed to provide a good ohmic contract to the subsequent semiconducting layers. The active diode layers 50 and 60 are deposited on top of layer 40. An active p/n junction is located at the interface between layers 50 and 60 formed by $NiO_x$ which is a known p-type semiconductor material and indium tin oxide which is an n-type semiconductor material, respectively. $NiO_x$ is a critical ingredient in the thin film diode. A mixed oxide of nickel and iron produced by thermal oxidation or reactive sputtering of nickel (81%) and iron (19%) target may also serve as a p-type semiconductor layer. However, better results are achieved with pure $NiO_x$ than with the mixed oxide of nickel and iron.

The conductivity of $NiO_x$ is critical to the operation of the thin film diode. If not properly optimized, it leads to diodes with strongly reduced forward currents. Stoichiometric NiO is a strong insulator. However, Ni vacancies in $NiO_x$ produce hole carriers and resistivities in the semiconductor range (1 ohm-cm) are exhibited. In the case of reactive sputtering of $NiO_x$, the oxygen partial pressure is a key parameter in controlling the film stoichiometry.

The n-type semiconductor layer 60 of indium tin oxide (ITO) produces diodes with low turn-on voltages and sharp current-voltage curves. The exact composition for the choice of ITO, is not essential. Good results have been achieved by reactive sputtering from a metallic target of composition In (50%) Sn(50%). Other materials closely related to ITO in their electrical properties include the most commonly used conductive oxides such as tin oxide, indium oxide and zinc oxide. These materials are normally used with various dopants to optimize transparency and conductance, such as a tin-oxide-doped indium oxide.

ITO conductivity is critical. Contrary to $NiO_x$, the conductivity of ITO must be prevented from becoming too high (i.e., the resistivity must not be too low), in which case, the diodes degenerate into pure ohmic junctions. Such is the case when ITO is deposited in pure argon leading to resistivities as low as $10^{-3}$ ohm-cm or less. However, depositions in argon plus oxygen gas mixtures yields good diodes.

Both the oxygen and water partial pressures during $NiO_x$ deposition have a strong effect on both the conductivity of the individual layers and the current-voltage characteristics of the resulting thin film diodes. For instance, we have found that the turn-on voltage of thin film diodes based on $NiO_x$ and ITO varies from 0.35 Volt to 0.60 Volt when the base or background pressure in the sputtering chamber varies from 5 E-7 Torr to 1.5 E-5 Torr.

Turning again to FIG. 1, a top metal contact 70 is deposited on top of the semiconducting layer 60 and defines the diode area. Diodes having conductive areas ranging from 100 $\mu m^2$ to 4000 $\mu m^2$ were fabricated. In one form layer 70 consists of 2000 Å of a gold indium (AuIn) alloy. A dielectric layer 80, sputtered alumina, for example, coats all layers and edges of the diode. After deposition of an appropriate seed layer 90, in one form 3000 Å of sputtered nickel, gold conductors 100 are plated, and are used as low resistance connections to the two terminals 40,70 of the diode.

Proper selection of the material for the metal contact layers 40 and 70 formed on the semiconducting layers 50 and 60 is critical to the thin film diode function. The primary requirement, to obtain high current capability, is good ohmic contact. This can be achieved when Au or AuIn is used to contact the ITO layer and when Ni is used to contact the $NiO_x$ layer.

When $NiO_x$/ITO diodes are formed with the $NiO_x$ deposited directly on a gold or copper layer, electrical shorts may be formed caused by the inability of the $NiO_x$ layer to cover the metal. Depositing a thin layer of suitable material on top of the gold or copper, such as a few hundred angstroms of nickel, overcomes such shorting problems.

Figure 2:
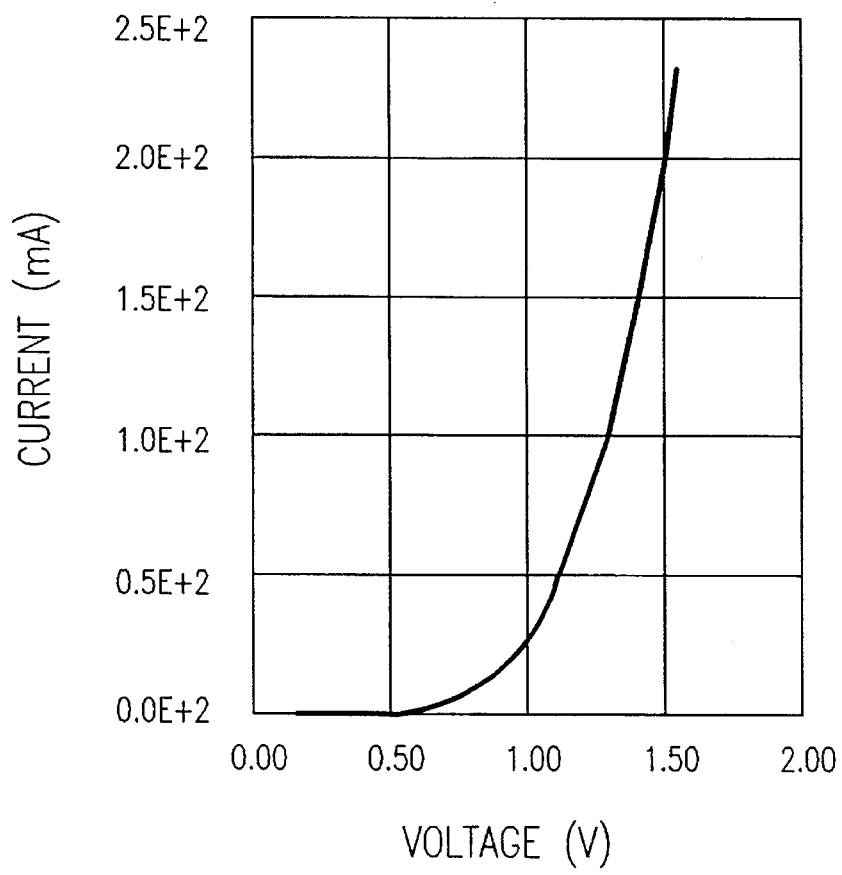
FIG. 2 is a graph of the current versus forward voltage characteristics of a thin film diode based upon the embodiment shown in FIG. 1.

Turning to FIG. 2, the diode-like properties of the p/n junction, layers 50 and 60, of FIG. 1 are evident. The voltage on the x-axis refers to the voltage on the upper metal contact 70, while the lower metal contact, layers 20, 30, and 40, is at ground potential. The forward direction corresponds to negative voltages on contact 70. The junction area is 1000 $\mu m^2$. The turn-on voltage is about 0.4 Volt, and the DC current can exceed 0.2 A, without causing diode burnout. The current at reversed voltages is typically more than 3 orders of magnitude lower than at similar forward voltages, indicating that the junction has strong rectifying characteristics. Diodes capable of DC current densities in excess of 10,000 $A/cm^2$ are generally obtained. Larger currents can be sustained for a short duration. When tested under Human Body Model current pulses, the same diodes can withstand peak currents of up to 2.7 A. (charging voltages of 4000 volts) corresponding to peak current densities of 270,000 $A/cm^2$. Typical dynamic resistance for a 1000 $\mu m^2$ diode at forward currents above 100 mA, is in the range of 1 to 2 ohm. Different n-type layers, zinc oxide, indium oxide and tin oxide, for example, generally produce diodes having lower current capability than ITO.

Figure 3:
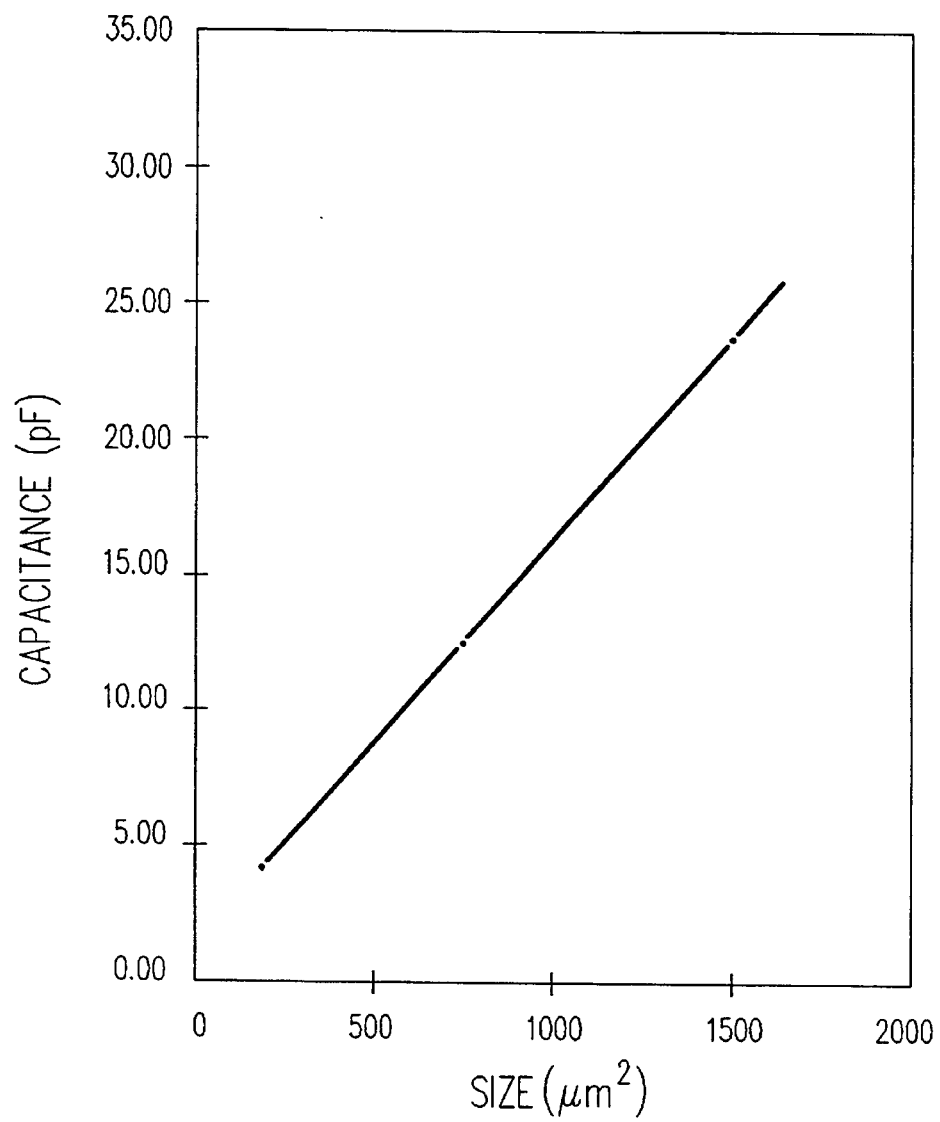
FIG. 3 is a graph of capacitance versus thin film diode junction area at a frequency of 1 MHz and under a forward bias voltage of 200 mV.

Turning to FIG. 3, the diode capacitance is shown at a frequency of 1 Mhz and an applied forward DC voltage of 0.2 volt, as a function of diode size (i.e., junction area). Under these conditions the diode's specific capacitance is about 1.5 E-6 $F/cm^2$.

Figure 4:
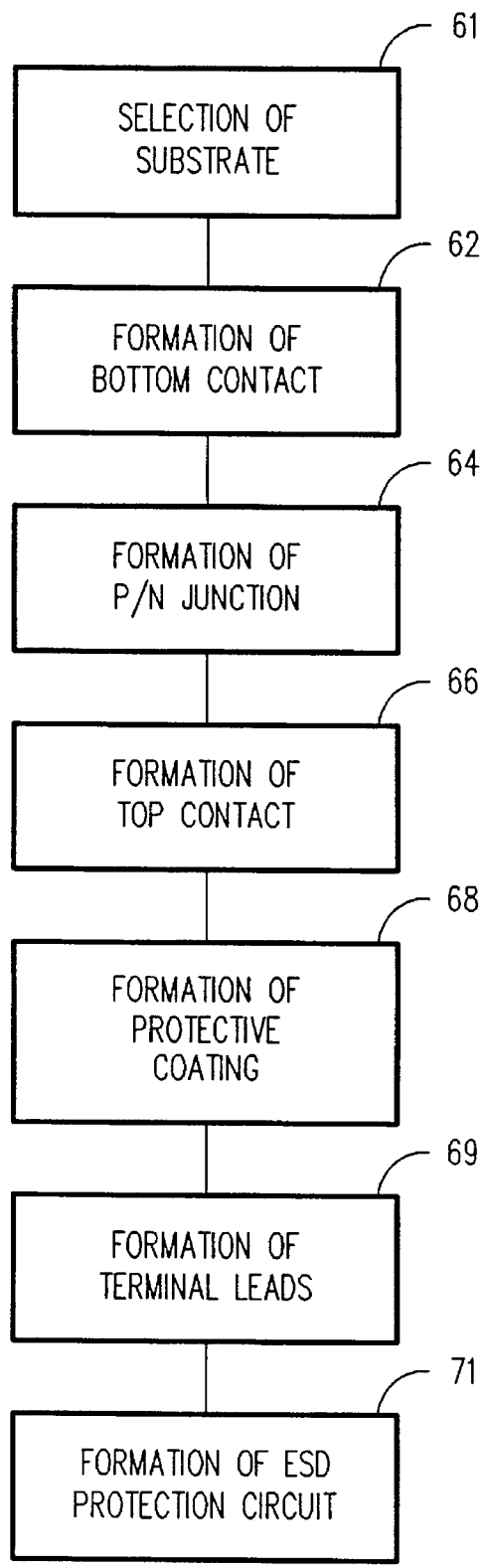
FIG. 4 is a flow diagram indicating the process steps in forming the thin film diode of FIG. 1 for an integrated device.

The thin film diode of FIG. 1 may be fabricated in a process as shown in FIG. 4. In a step 61, a substrate 10 is selected for the diode. The substrate may be of any arbitrary material. The fabrication process for the diode 1 is relatively low temperature, the highest temperatures encountered during the process being a maximum of 100° to 120° C. Additionally, there are no lengthy annealing cycles required. Thus, the substrate may be any suitable material capable of withstanding the maximum process temperatures. In one form, the substrate may be of a flexible polyimide material. In another form the substrate may be of a material suitable for a liquid crystal display.

In another example, as in the case of FIG. 1, the substrate 10 may be an $Al_2O_3$-TiC ceramic coated with sputtered $Al_2O_3$. Alternatively, the substrate may be any dielectric material, such as $Al_2O_3$, $SiO_2$ and the like.

In step 62, a photoresist layer is prepared on the substrate in order to form a stencil mask. The stencil is used to define the shape of the bottom contact 15. The substrate is then placed in a sputtering apparatus such as a Perkin Elmer 4400, equipped with DC magnetron sputtering capability. An adhesion layer 20 of nickel, typically in the range of 100 to 300 Å, is deposited. In the same chamber, a copper layer 30 in the range of 1000 to 3000 Å is deposited and overlayed by a layer 40 of nickel having a thickness in the range of 100 to 300 Å. The stencil, along with unwanted deposited material, is then removed in a lift-off process.

In step 64, a photoresist layer is prepared on the substrate over the bottom contact 15 in order to form a stencil mask. The stencil is used to define the shape of the p/n junction. The latter is formed on top and within the boundaries of the bottom contact 15. The substrate is then placed in a sputtering apparatus capable of RF sputtering. A $NiO_x$ film 50 is reactively sputtered over the nickel layer 40 of the bottom contact to form a p-type semiconductor layer. The nickel oxide is sputtered from a metallic nickel target in a gas mixture of argon and oxygen in a range from 5 to 20% using an RF diode process. The $NiO_x$ is deposited to a thickness in the range of 125 Å to 800 Å. Alternatively, a nickel oxide target may be used. An n-type layer 60 of indium tin oxide is then formed on the $NiO_x$ p-type layer. The ITO layer is deposited in the same sputtering system following the deposition of the $NiO_x$ film. The ITO is reactively sputtered to a thickness in the range from 600 Å to 2400 Å under the same conditions as the $NiO_x$ using an oxide target containing a mixture of approximately 90% indium oxide and 10% tin oxide. Reactive sputtering from a metallic indium tin target may also be used. The stencil, along with unwanted deposited material, is then removed in a lift-off process.

In step 66, a photoresist layer is prepared on the substrate over the p/n junction top layer 50 in order to form a stencil mask. The stencil is used to define the shape of the top contact 70. The latter is formed on top and within the boundaries of the p/n junction defined in step 64. In a sputtering apparatus as described in step 62, and under similar processing conditions, a AuIn film 70 is deposited to a thickness in the range from 500 to 2000 Å. The stencil, along with unwanted deposited material, is then removed in a lift-off process.

In step 68, a protective coating 80 of dielectric material such $Al_2O_3$ or $SiO_2$ or hydrogenated carbon, is formed over the entire substrate, thereby protecting all metallic and p/n-type layers, and their exposed edges and surfaces. The dielectric layer, such as $Al_2O_3$ may be formed by sputtering to a thickness in the range from 0.1 to 5.0 $\mu m$.

In step 69, low resistance leads 100 are connected to the p and n side of the junction, thus forming the two terminals of the thin film diode. To this end a photoresist layer is prepared to allow etching of vias into the dielectric layer 80. The vias are designed to expose a portion of the metallic surface of the top and bottom contacts 15 and 70. In one embodiment the terminal leads 100 are plated. In this case, after formation of the vias and removal of the photoresist, a metallic seed layer 90 is formed by sputtering over the entire substrate. This metallic seed layer 90 may consist of Ni in the thickness range of 1000 to 3000 Å.

Subsequently, a photoresist layer is prepared on the substrate over the seed layer 90 in order to form a stencil mask. The stencil is used to define the shape of the terminal leads 100. A conductive material as Au is plated to a thickness in the range of 1 to 4 micron. After removal of the photoresist stencil, undesired portions of the metallic seed layer are removed by either a wet etch or ion milling process.

Figure 5:
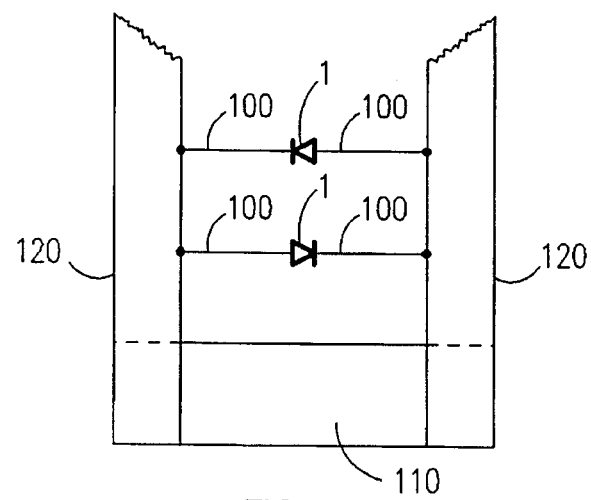
FIG. 5 is a diagram illustrating a magnetoresistive sensor provided with ESD protection according to the principles of the present invention.

In step 71, the thin film diode 1 thus fabricated may be connected to a magnetoresistive (MR) sensor formed on the substrate. In this embodiment the terminal leads 100 of a pair of diodes 1 are extended to electrically contact the leads 120 of the MR sensor 110 so as to produce a parallel connection of the diodes with the sensor as shown in FIG. 5, the diodes 1 being connected in parallel, "back-to-back." More than one diode of either polarity may be connected simultaneously with the same fabrication process. One example of an ESD protective circuit including an MR sensor in parallel connection with one or more diodes is described in U.S. Pat. No. 5,465,186, filed Jan. 26, 1994, and assigned to the assignee of the present invention. The MR sensor 110 is a thin metal film resistor typically a few tens of ohms in resistance, of extremely small volume and vulnerable to current transients. The thin film diodes 1 connected in parallel with the MR sensor 110 minimize the buildup of static charge and alleviate the problem of ESD current pulses which may arise in the handling of the MR sensor.

In a similar fashion, the thin film diode 1 can be used to limit the voltage or the current on sensitive devices fabricated on surfaces, such as glass, where conventional diode fabrication is not possible or convenient.

In another embodiment, the thin film diode can be connected to a switching element in a matrix for a liquid crystal display.

For high current applications, measures must be taken to minimize the series resistance. To this end, the thickness, geometry and separation of the metal contacts 15, 70 must be optimized. The layout of a single diode can be easily expanded to multi-diode circuits (back-to-back diodes, current rectifying bridges, etc.) by appropriate patterning of the bottom contact and the terminal leads. Turn-on voltage may be adjusted by processing conditions, or by a series connection of multiple diodes. Adjustment of the p/n junction area can be used to trade off capacitance and current carrying performance.

In summary, the present invention discloses thin film diodes with very large current capability, low forward resistance and low turn-on voltage. The diodes have particular application when connected in parallel with MR sensors by protecting the sensor against static electric charges discharges. The thin film diode, when connected as an ESD protection element, provides a ten-fold increase in the threshold voltage for MR sensor damage.

While the invention has been described in conjunction with several specific embodiments, it is evident to those skilled in the art that many further alternatives, modifications, and variations will be apparent in the light of the foregoing description. Thus, the invention described herein is intended to embrace all such alternatives, modifications, and applications and variations as may fall within the spirit and scope of the appended claims.

We claim:

1. A thin film rectifying pn diode having large current capability, low turn on voltage as a switching or protective device in an integrated device comprising:

a first semiconductor thin film layer including $NiO_x$ material having p-type properties, said first semiconductor thin film layer having first and second surfaces;

a second semiconductor layer of a conductive oxide having n-type properties with first and second surfaces, the first surface thereof joined to the second surface of said first semiconductor thin film layer thereby forming a p/n junction; and a first metal contact joined to the first surface of the first semiconductor thin film layer and a second metal contact joined to the second surface of the second semiconductor layer providing ohmic contacts for the thin film diode.

2. The thin film device of claim 1 wherein the first semiconducting thin film layer comprises a mixed oxide of nickel and iron.

3. The thin film diode of claim 1 wherein the second semiconducting layer is a conductive oxide selected from the group consisting of tin oxide, indium oxide, zinc oxide and a mixture of tin oxide and indium oxide.

4. The thin film diode of claim 3 wherein the second semiconducting layer comprises indium tin oxide.

5. The thin film diode of claim 1 wherein the first semiconductor thin film is formed by sputtering in an atmosphere having a partial oxygen pressure to control the stoichiometry of the film.

6. The thin film diode of claim 5 wherein the base pressure in a sputtering chamber is in the range of 5 E-7 to 1.5 E-5 Torr.

7. The thin film diode of claim 1 connected in parallel with a magnetoresistive sensor for protection against electrostatic discharges.

8. The thin film diode of claim 1 formed on a substrate.

9. The thin film diode of claim 8 wherein said substrate is of a material selected from the group consisting of glass, aluminum oxide, silicon, silicon dioxide, and aluminum oxide-titanium carbide ceramic.

10. The thin film diode of claim 1 wherein said first metal contact comprises an adhesion layer of a first conductive material and a conduction layer of a second conductive material, said adhesion layer in contact with the first surface of said first semiconductor layer.

11. The thin film diode of claim 10 wherein said first conductive material comprises nickel.

12. The thin film diode of claim 11 wherein said second conductive material is selected from the group consisting of copper and gold.

13. The thin film diode of claim 1 wherein said second metal contact comprises a conductive metal selected from the group consisting of gold and gold indium.

14. The thin film diode of claim 13 wherein said second metal contact comprises gold indium.

15. The thin film diode of claim 1 further comprising first and second conductive leads connected to the first and second metal contacts, respectively.

* * * * *